(12) United States Patent
Matsuo et al.

(10) Patent No.: US 12,022,581 B2
(45) Date of Patent: Jun. 25, 2024

(54) DISPLAY DEVICE

(71) Applicant: SONY SEMICONDUCTOR SOLUTIONS CORPORATION, Kanagawa (JP)

(72) Inventors: Seiya Matsuo, Kanagawa (JP); Masaki Yoshioka, Kanagawa (JP); Kouichi Hashikaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 79 days.

(21) Appl. No.: 17/758,991

(22) PCT Filed: Jan. 19, 2021

(86) PCT No.: PCT/JP2021/001704
§ 371 (c)(1),
(2) Date: Jul. 18, 2022

(87) PCT Pub. No.: WO2021/153352
PCT Pub. Date: Aug. 5, 2021

(65) Prior Publication Data
US 2023/0030258 A1    Feb. 2, 2023

(30) Foreign Application Priority Data

Jan. 27, 2020  (JP) .................... 2020-011184

(51) Int. Cl.
*G09G 3/3233* (2016.01)
*H05B 33/02* (2006.01)
*H10K 59/12* (2023.01)

(52) U.S. Cl.
CPC ........... *H05B 33/02* (2013.01); *G09G 3/3233* (2013.01); *G09G 2300/0842* (2013.01);
(Continued)

(58) Field of Classification Search
CPC ................. H05B 33/02; G09G 3/3233; G09G 2300/0842; G09G 2320/0233;
(Continued)

(56) References Cited

U.S. PATENT DOCUMENTS 5,170,155 A * 12/1992 Plus .................... G09G 3/3688
345/204
2018/0247590 A1* 8/2018 Toyomura ............ H10K 50/125
(Continued)

FOREIGN PATENT DOCUMENTS

| JP | 05-503175 A | 5/1993 |
|----|-------------|--------|
| JP | 2002-040982 A | 2/2002 |

(Continued)

OTHER PUBLICATIONS

International Search Report and Written Opinion of PCT Application No. PCT/JP2021/001704, dated Mar. 23, 2021, 08 pages of ISRWO.

*Primary Examiner* — Ryan Jager
(74) *Attorney, Agent, or Firm* — CHIP LAW GROUP

(57) ABSTRACT

To improve display quality in a case where pixels are driven by using a ramp wave voltage.
A display device includes a plurality of pixel circuits arranged in at least one direction, a plurality of signal lines that supplies the plurality of pixel circuits with signal voltage corresponding to gradation, a voltage output unit that generates ramp wave voltage having a voltage level that changes with time, a ramp wiring that supplies the ramp wave voltage generated in the voltage output unit, a plurality of voltage holding units that is connected between the ramp wiring and the plurality of signal lines, and holds the ramp wave voltage at a timing corresponding to luminance of the plurality of pixel circuits to generate the signal voltage, a plurality of correction current sources that supplies correction current to a plurality of connection paths of the ramp (Continued)

wiring and the plurality of voltage holding units, and a current adjustment unit that adjusts the correction current on the basis of a voltage difference, on a predetermined connection path, of when setting a predetermined luminance to a pixel circuit connected to the predetermined connection path, in a case where the correction current is passed from the plurality of correction current sources to the plurality of connection paths, and in a case where the correction current is not passed from the plurality of correction current sources to the plurality of connection paths.

16 Claims, 12 Drawing Sheets

(52) U.S. Cl.
CPC ............... *G09G 2320/0233* (2013.01); *G09G 2320/0626* (2013.01); *G09G 2360/10* (2013.01); *H10K 59/12* (2023.02)

(58) Field of Classification Search
CPC ....... G09G 2320/0626; G09G 2360/10; G09G 2300/0819; G09G 2300/0852; G09G 2300/0861; G09G 2310/066; G09G 3/3291; G09G 2320/0223; G09G 3/3283; H10K 59/12; H10K 59/131
USPC .......................................................... 315/291
See application file for complete search history.

(56) References Cited

U.S. PATENT DOCUMENTS

| | | | |
|---|---|---|---|
| 2021/0185262 A1* | 6/2021 | Osawa | H04N 23/00 |
| 2023/0030258 A1* | 2/2023 | Matsuo | H05B 33/02 |
| 2023/0298533 A1* | 9/2023 | Yoshioka | G09G 3/3291 |
| | | | 345/55 |
| 2023/0353907 A1* | 11/2023 | Moue | H04N 25/78 |

FOREIGN PATENT DOCUMENTS

| | | |
|---|---|---|
| JP | 2004-133240 A | 4/2004 |
| JP | 2013-044847 A | 3/2013 |
| JP | 2017-068033 A | 4/2017 |
| WO | 92/07351 A1 | 4/1992 |
| WO | 2017/056646 A1 | 4/2017 |

* cited by examiner

DISPLAY DEVICE

CROSS REFERENCE TO RELATED APPLICATIONS

This application is a U.S. National Phase of International Patent Application No. PCT/JP2021/001704 filed on Jan. 19, 2021, which claims priority benefit of Japanese Patent Application No. JP 2020-011184 filed in the Japan Patent Office on Jan. 27, 2020. Each of the above-referenced applications is hereby incorporated herein by reference in its entirety.

TECHNICAL FIELD

The present disclosure relates to a display device.

BACKGROUND ART

There is an increasing demand for image quality of organic electroluminescence (EL) devices and liquid crystal display devices, and various kinds of measures for improving image quality have been made. For example, an organic EL device uses self-luminous elements, and thus has better contrast than a liquid crystal display device does. However, manufacturing variations occur in threshold voltage and mobility of a transistor in a pixel circuit for driving the self-luminous elements. Therefore, a pixel circuit for correcting these variations has been developed (refer to Patent Document 1).

CITATION LIST

Patent Document

Patent Document 1: Japanese Patent Application Laid-Open No. 2004-133240

SUMMARY OF THE INVENTION

Problems to be Solved by the Invention

However, in a case where an image having significantly different luminance is displayed on the same horizontal line of the display screen, there is a case where the image is displayed with brightness different from original luminance due to adjacent pixels. For example, in a case where an image in which a pixel region on a part of a left or right side of the display screen has luminance different from luminance of the remaining pixel region is displayed, the partial pixel region may be displayed with brightness different from original luminance, and a streak may be visually recognized on a boundary of a part of a display region.

This phenomenon occurs in a case where pixels are driven by using a system in which a ramp wave voltage is supplied to a ramp wiring connected to all pixels on one horizontal line, and a signal voltage corresponding to luminance of each pixel is held for each pixel. Specifically, this is caused by a voltage drop due to wiring resistance of the ramp wiring or pixel load capacitance.

Therefore, the present disclosure provides a display device capable of improving display quality in a case where pixels are driven by using a ramp wave voltage.

Solutions to Problems

In order to solve the problem described above, according to the present disclosure, there is provided a display device including a plurality of pixel circuits arranged in at least one direction, a plurality of signal lines that supplies the plurality of pixel circuits with signal voltage corresponding to gradation, a voltage output unit that generates a ramp wave voltage having a voltage level that changes with time;

a ramp wiring that supplies the ramp wave voltage generated in the voltage output unit, a plurality of voltage holding units that is connected between the ramp wiring and the plurality of signal lines, and holds the ramp wave voltage at a timing corresponding to luminance of the plurality of pixel circuits to generate the signal voltage, a plurality of correction current sources that supplies correction current to a plurality of connection paths of the ramp wiring and the plurality of voltage holding units, and a current adjustment unit that adjusts the correction current on the basis of a voltage difference, on a predetermined connection path, of when setting a predetermined luminance to a pixel circuit connected to the predetermined connection path, in a case where the correction current is passed from the plurality of correction current sources to the plurality of connection paths, and in a case where the correction current is not passed from the plurality of correction current sources to the plurality of connection paths.

When the ramp wave voltage is supplied to the ramp wiring, the plurality of correction current sources may supply the same correction current to the plurality of connection paths regardless of a luminance set to the plurality of pixel circuits.

The predetermined connection path may include a connection path at a farthest end on the ramp wiring from a position of the voltage output unit, and the predetermined luminance may include white luminance.

The current adjustment unit may have a first voltage detection unit that detects voltage, on the connection path at the farthest end from the voltage output unit, of when a first luminance is set to the plurality of pixel circuits without passing the correction current from the plurality of correction current sources to the plurality of connection paths, and a second voltage detection unit that detects voltage on the connection path at the farthest end for when passing the correction current from the plurality of correction current sources to connection paths excluding the connection path at the farthest end to set the first luminance to a pixel circuit connected to the connection path at the farthest end and to set a second luminance to pixel circuits other than the pixel circuit connected to the connection path at the farthest end, and the current adjustment unit may adjust the correction current on the basis of the voltage difference between the voltage detected by the first voltage detection unit and the voltage detected by the second voltage detection unit.

The current adjustment unit may adjust the correction current so that the voltage detected by the second voltage detection unit matches the voltage detected by the first voltage detection unit.

The current adjustment unit may perform a plurality of times, once for each horizontal line scanning timing, processing of increasing the correction current in a case where the voltage detected by the second voltage detection unit is lower than the voltage detected by the first voltage detection unit, and of decreasing the correction current in a case where the voltage detected by the second voltage detection unit is higher than the voltage detected by the first voltage detection unit.

The current adjustment unit may have
a voltage comparator that outputs a signal corresponding to a voltage difference between the voltage detected by the first voltage detection unit and the voltage detected by the second voltage detection unit, and
an adjustment signal generation unit that generates, on the basis of the signal output from the voltage comparator, an adjustment signal including a plurality of bits, the adjustment signal being for the current adjustment unit to adjust the correction current, and
the current adjustment unit may adjust the correction current on the basis of the adjustment signal.

The adjustment signal generation unit may adjust the adjustment signal by one bit each time the correction current is adjusted.

The current adjustment unit may have
a voltage comparator that outputs a signal corresponding to a voltage difference between the voltage detected by the first voltage detection unit and the voltage detected by the second voltage detection unit,
a phase comparator that outputs a signal corresponding to a phase difference between the signal output from the voltage comparator and a predetermined reference signal, and
a charge pump that outputs voltage corresponding to the signal output from the phase comparator, and
the current adjustment unit may adjust the correction current on the basis of the voltage output from the charge pump.

The predetermined reference signal may have frequency corresponding to a horizontal line scanning period, and
the voltage comparator may output a signal corresponding to the voltage difference once for each horizontal line.

The correction current source may have a transistor that changes the correction current according to gate voltage, and may further include a bias circuit that controls the gate voltage with the voltage output from the charge pump.

The first luminance may include white luminance, and the second luminance may include black luminance.

The voltage output unit may output offset voltage for correcting a variation in characteristic of the plurality of pixel circuits to the ramp wiring before outputting the ramp wave voltage to the ramp wiring, and
when the voltage output unit supplies the offset voltage to the ramp wiring, the current adjustment unit may adjust, on the basis of the voltage difference, the correction current supplied to the plurality of connection paths by the plurality of correction current sources.

The current adjustment unit may supply the same correction current from the plurality of correction current sources to the plurality of connection paths in a case where the voltage output unit supplies the offset voltage to the ramp wiring and in a case where the voltage output unit supplies the ramp voltage to the ramp wiring.

The current adjustment unit may adjust the correction current a plurality of times, one time each in accordance with horizontal line scanning, within a blanking period between two consecutive frames.

According to the present disclosure, there is provided a display device including
a plurality of pixel circuits arranged in at least one direction,
a plurality of signal lines that supplies the plurality of pixel circuits with signal voltage corresponding to gradation,
a voltage output unit that generates offset voltage for correcting a variation in characteristic of the plurality of pixel circuits and ramp wave voltage having a voltage level that changes with time,
a ramp wiring that switches to the offset voltage or the ramp wave voltage and supplies the switched voltage,
a plurality of voltage holding units that is connected between the ramp wiring and the plurality of signal lines, and holds the ramp wave voltage at a timing corresponding to luminance of the plurality of pixel circuits to generate the signal voltage,
a plurality of correction current sources that supplies correction current to a plurality of connection paths of the ramp wiring and the plurality of voltage holding units, and
a current adjustment unit that adjusts, on the basis of a voltage difference of the plurality of connection paths, the voltage difference being generated due to current that flows from the plurality of voltage holding units to the voltage output unit when a predetermined luminance is set to the plurality of pixel circuits, the correction current supplied to the plurality of connection paths by the plurality of correction current sources when the offset voltage and the ramp wave voltage are supplied to the ramp wiring.

MODE FOR CARRYING OUT THE INVENTION

Hereinafter, embodiments of a display device will be described with reference to the drawings. Although main components of the display device will be mainly described below, the display device may have a component or function that is not illustrated or described. The following description does not exclude the component or function that is not illustrated or described.

First Embodiment

Figure 1:
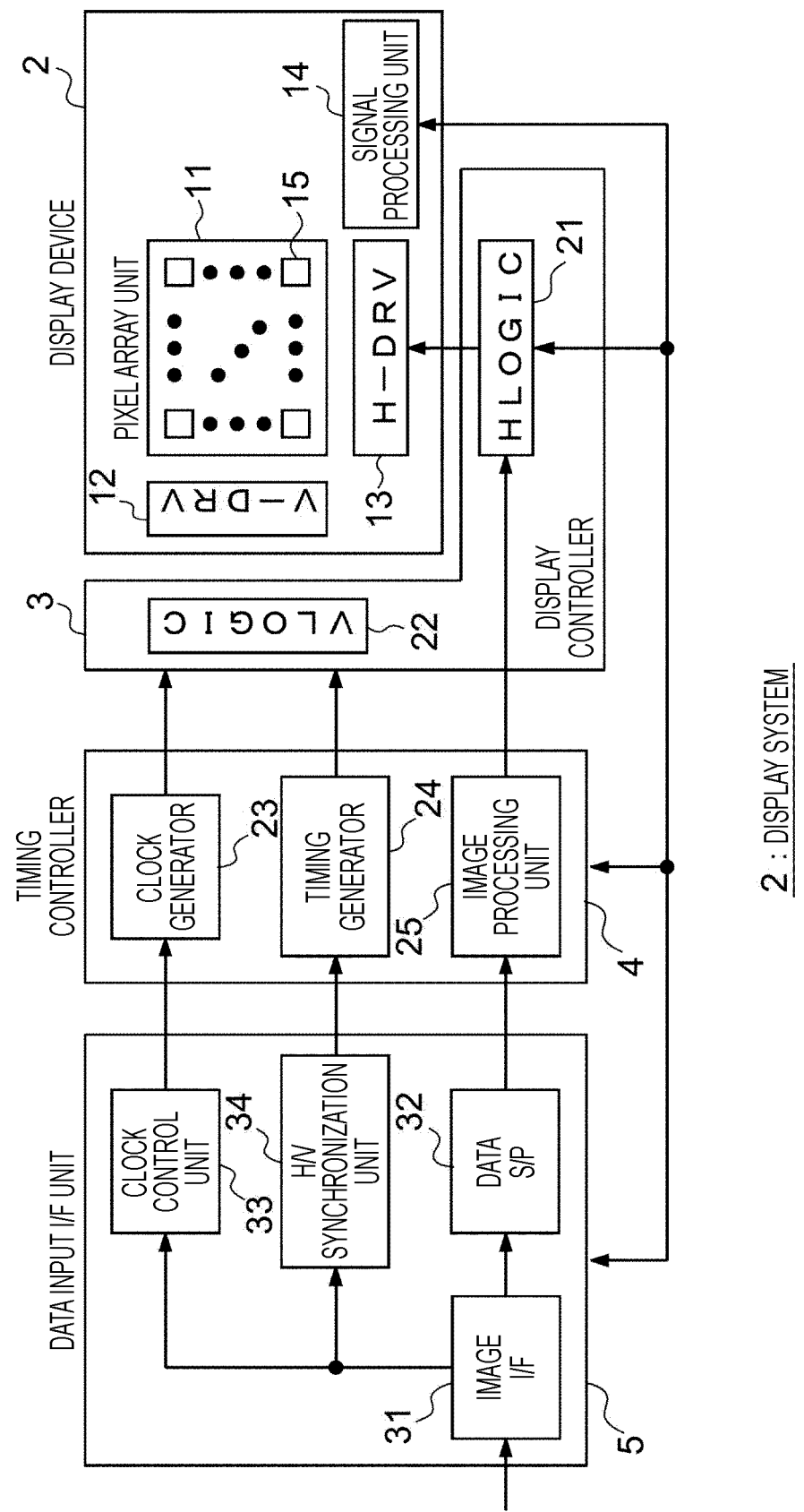
FIG. 1 is a block diagram illustrating a schematic configuration of a display system 2 including a display device according to a first embodiment.

FIG. 1 is a block diagram illustrating a schematic configuration of a display system 2 including a display device 1 according to a first embodiment. The display system 2 in FIG. 1 illustrates a configuration of a micro organic light emitting diode (OLED) system. Note that the display device 1 according to the present embodiment is also applicable to the display system 2 including a display device 1 having a large screen, such as a TV or a PC monitor.

The display system 2 in FIG. 1 includes the display device 1, a display controller 3, timing controller 4, and a data input/output I/F unit 5. Note that, although the display controller 3 and the like are separated from the display device 1 in FIG. 1, a display controller or the like may be integrated into the display device 1.

The display device 1 has a pixel array unit 11, a V-DRV unit 12, an H-DRV unit 13, and a signal processing unit 14.

The pixel array unit 11 has a plurality of pixel circuits 15 arranged in a horizontal direction and a vertical direction. Each of the pixel circuits 15 has, for example, a light emission part such as an organic EL element, a plurality of transistors that controls the light emission part, and a plurality of capacitors. An internal configuration of the pixel circuit 15 will be described later.

On the pixel array unit 11, the signal processing unit 14 performs signal processing of a video signal to be displayed. Specific content of the signal processing is not limited, and is, for example, gamma correction or the like. The video signal subjected to the signal processing by the signal processing unit 14 is transmitted to the H-DRV unit 13.

Figure 2:
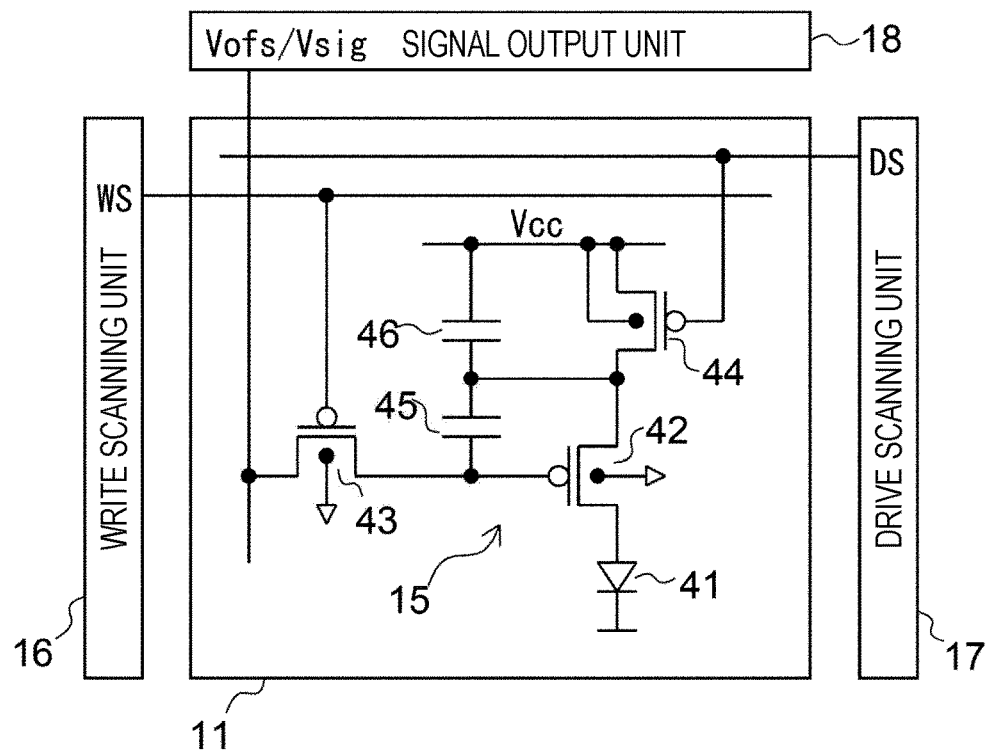
FIG. 2 is a circuit diagram illustrating an internal configuration of a pixel circuit.
Figure 3:
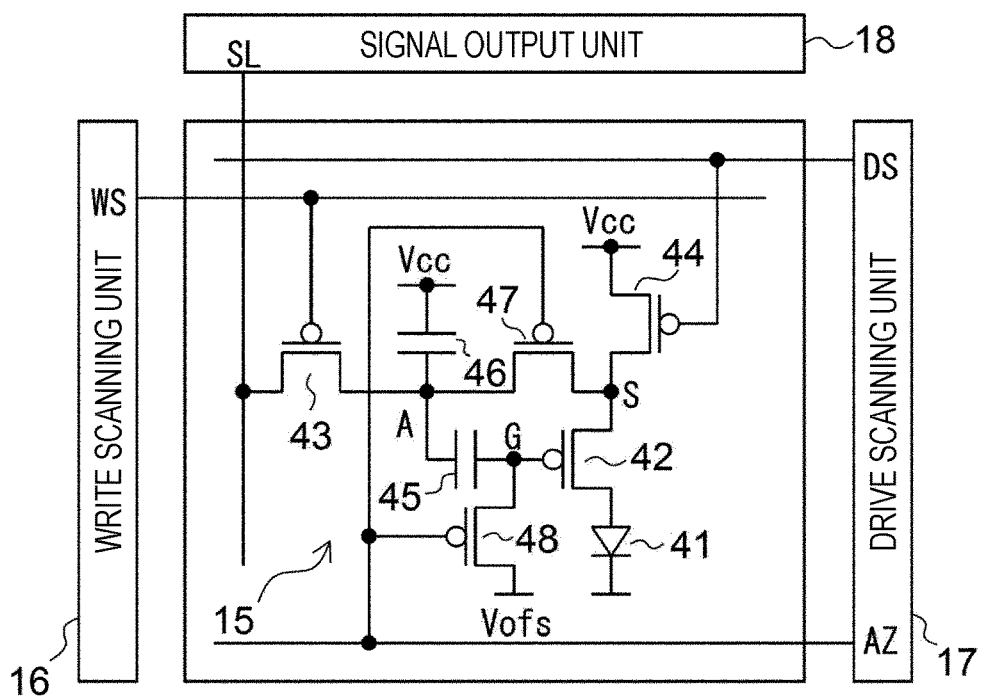
FIG. 3 is a circuit diagram illustrating an internal configuration of a pixel circuit.

As illustrated in FIGS. 2 and 3 to be described later, the V-DRV unit 12 has a write scanning unit 16 and a drive scanning unit 17. When writing a signal voltage to each of the pixel circuits 15, the write scanning unit 16 sequentially supplies a write scanning signal to each scanning line to sequentially drive each of scanning lines WS1 to WSn. The drive scanning unit 17 supplies a light emission control signal to each drive line in synchronization with the line-sequential scanning by the write scanning unit 16, and controls light emission and non-light emission of the light emission part.

The H-DRV unit 13 has a signal output unit 18 as illustrated in FIGS. 2 and 3. The signal output unit 18 holds a ramp wave voltage at a timing corresponding to gradation of each pixel to generate a signal voltage. The signal output unit 18 selectively selects the signal voltage or an offset voltage Vofs and supplies the signal voltage or the offset voltage Vofs to a corresponding signal line. The offset voltage Vofs is a voltage serving as a reference of a signal voltage (for example, a voltage corresponding to a black level of a video signal), and is used to perform threshold correction operation to be described later.

The signal voltage or offset voltage Vofs alternatively output from the signal output unit 18 is supplied to each of the pixel circuits 15 via the signal line, and is set in each of the pixel circuits 15 in units of rows selected by scanning by the write scanning unit 16.

The display controller 3 has an HLOGIC unit 21 and a VLOGIC unit 22, and performs display control on the pixel array unit 11.

The HLOGIC unit 21 supplies the video signal to the H-DRV unit 13. The VLOGIC unit 22 supplies a signal that specifies timings of a scanning line and a drive line to the V-DRV unit 12.

The timing controller 4 has a clock generator 23, a timing generator 24, and an image processing unit 25. The clock generator 23 generates a vertical synchronization clock and a horizontal synchronization clock of the display device 1, and supplies a vertical synchronization clock and a horizontal synchronization clock to the display controller 3. The timing generator 24 generates a signal that specifies an operation timing of the display controller 3 and supplies the signal to the display controller 3. The image processing unit 25 performs various kinds of image processing on the video signal input to the data input/output I/F unit 5. The video signal subjected to the image processing is supplied to the HLOGIC unit 21 in the display controller 3.

The data input/output I/F unit 5 has an image I/F unit 31, a data S/P unit 32, a clock control unit 33, and an H/V synchronization unit 34. The image I/F unit 31 receives a video signal from an outside. The video signal is serial digital data. The data S/P unit 32 converts the video signal into parallel data, and then transmits the parallel data to the image processing unit 25 in the timing controller 4. The clock control unit 33 generates a clock that suits display frequency of the display device 1. The H/V synchronization unit 34 generates a signal that specifies the horizontal synchronization timing and vertical synchronization timing of the display device 1, and transmits the signal to the timing generator 24.

FIG. 2 is a circuit diagram illustrating an internal configuration of the pixel circuits 15. The pixel circuit 15 in FIG. 2 has a light emission part 41 having an organic EL element, a drive transistor 42, a sampling transistor 43, a light emission control transistor 44, a holding capacitor 45, and an auxiliary capacitor 46. The pixel circuit 15 is formed on a semiconductor substrate such as silicon, and the drive transistor 42, the sampling transistor 43, and the light emission control transistor 44 are, for example, PMOS transistors. A power supply voltage is applied to a back gate of each of the transistors.

The sampling transistor 43 samples a signal voltage Vsig supplied from the signal output unit 18 via the signal line to write the signal voltage Vsig to the holding capacitor 45. The light emission control transistor 44 is connected between a power supply node of a power supply voltage Vcc and a source electrode of the drive transistor 42, and controls light emission/non-light emission of the light emission part 41 driven according to a light emission control signal DS.

The holding capacitor 45 is connected between a gate electrode and source electrode of the drive transistor 42. The holding capacitor 45 holds the signal voltage Vsig written by sampling by the sampling transistor 43. The drive transistor 42 drives the light emission part 41 by passing a drive current corresponding to holding voltage of the holding capacitor 45 through the light emission part 41. The auxiliary capacitor 46 is connected between the source electrode of the drive transistor 42 and a node at a fixed potential, for example, the power supply node of a power supply voltage Vcc. The auxiliary capacitor 46 reduces fluctuation in source potential of the drive transistor 42 when the signal voltage Vsig is written, and performs an action of matching a gate-source voltage Vgs of the drive transistor 42 with a threshold voltage Vth of the drive transistor 42.

An internal configuration of the pixel circuit 15 is not limited to the internal configuration illustrated in FIG. 2. For example, FIG. 3 is a circuit diagram of a pixel circuit 15 having an internal configuration different from the internal configuration in FIG. 2. The light emission control transistor 44 is connected between a power supply potential Vcc and a source S of a drive transistor 42, and controls on/off of the light emission part 41. A gate of the light emission control transistor 44 is connected to a scanning line DS.

The sampling transistor 43 is connected between a signal line SL and a connection node A of the holding capacitor 45 and auxiliary capacitor 46. A gate of the sampling transistor 43 is connected to a scanning line WS. A detection transistor 47 is connected between the connection node A and the source S of the drive transistor 42. A gate of the detection transistor 47 is connected to a scanning line AZ. A switching transistor 48 is connected between a gate G of the drive transistor 42 and a predetermined offset potential Vofs. A gate of the switching transistor 48 is connected to the scanning line AZ. The detection transistor 47 and the switching transistor 48 constitute a correction means for Vth cancellation. The holding capacitor 45 is connected between the connection node A and the gate G of the drive transistor 42, and the auxiliary capacitor 46 is connected between the power supply potential Vcc and the connection node A.

The drive transistor 42 drives the light emission part 41 by passing a drain current Ids between a source and a drain according to a gate voltage Vgs applied between the source and the gate. The gate voltage Vgs of the drive transistor 42 is set according to a video signal Vsig supplied from the signal line SL, and luminance of light emitted from the light emission part 41 can be controlled according to a gradation of the video signal by the drain current Ids of the drive transistor 42.

The threshold voltage Vth of the drive transistor 42 fluctuates for each pixel. In order to cancel the threshold voltage, the threshold voltage Vth of the drive transistor 42 is detected in advance and held in the holding capacitor 45. Thereafter, the sampling transistor 43 is turned on, and a signal potential Vsig is written to the auxiliary capacitor 46. With this arrangement, a gate potential Vgs in which a variation in the threshold voltage Vth of the drive transistor 42 is corrected is generated.

FIGS. 2 and 3 are examples of a pixel circuit 15, and a pixel circuit 15 having an internal configuration other than the internal configurations in FIGS. 2 and 3 can also be applied to a pixel circuit 15 according to the present embodiment.

Figure 4:
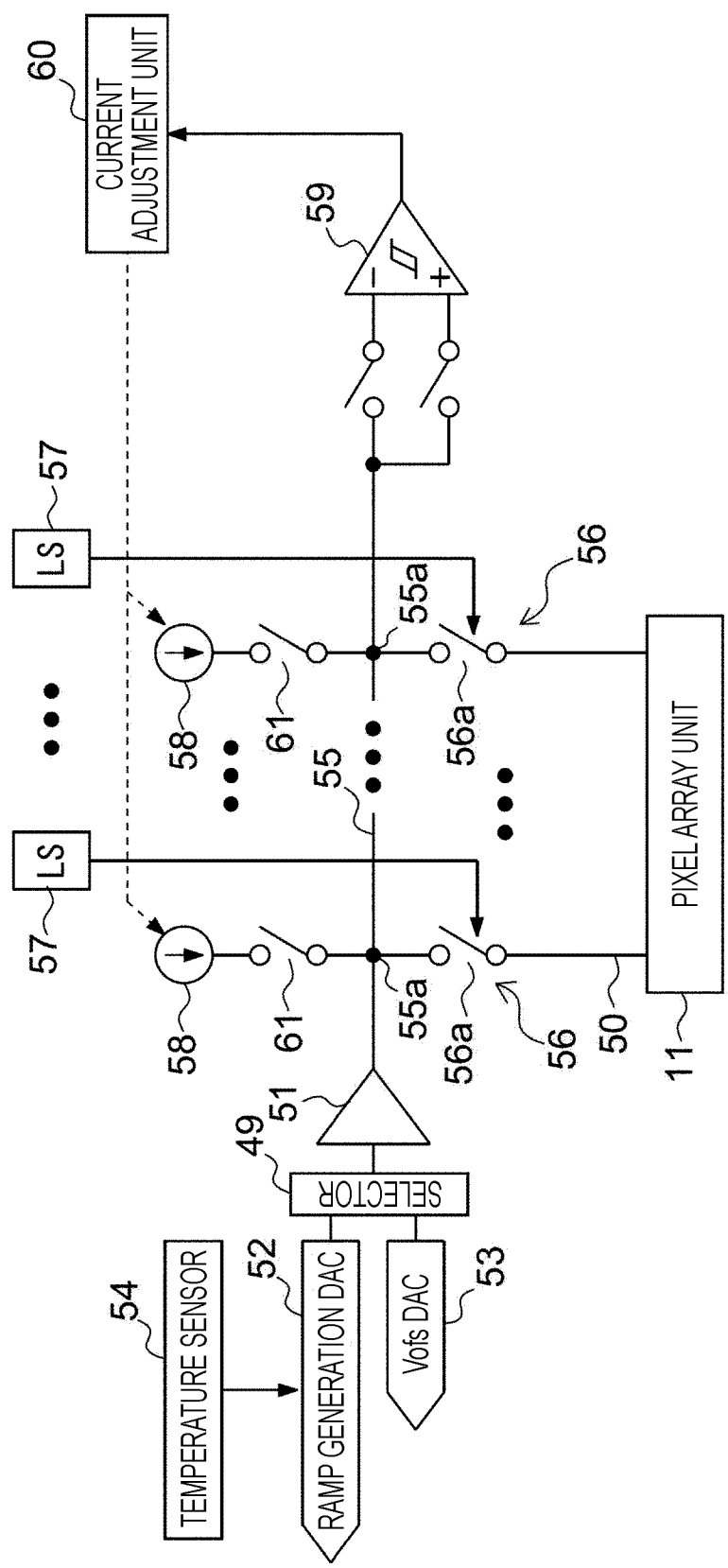
FIG. 4 is a block diagram illustrating an internal configuration of an H-DRV unit.

FIG. 4 is a block diagram illustrating an internal configuration of the H-DRV unit 13. The H-DRV unit 13 has a selector 49, a ramp buffer 51, a ramp generation DAC 52, a Vofs DAC 53, a temperature sensor 54, a ramp wiring 55, a plurality of voltage holding units 56, a plurality of level shifters (LS) 57, a plurality of correction current sources 58, a comparator 59, and a current adjustment unit 60.

The ramp buffer 51 switches to either an offset voltage for performing threshold correction and mobility correction of the drive transistor 42 in the pixel circuit 15, or a ramp wave voltage having a voltage level continuously changes by the selector 49, buffers the voltage, and then outputs the buffered voltage to the ramp wiring 55.

The plurality of voltage holding units 56 and a plurality of switches 61 are connected to the ramp wiring 55. At a time when the ramp wave voltage becomes a voltage corresponding to gradation of the pixel circuit 15, the plurality of voltage holding units 56 holds the voltage. The held voltage is a signal voltage and is supplied to a signal line 50.

Each of the voltage holding units 56 has a switch 56a. Each switch 56a in the each of the voltage holding units 56 is turned on or off according to output voltage of a corresponding level shifter 57. A PWM signal corresponding to gradation data of each pixel is input to the level shifter 57.

The plurality of correction current sources 58 supplies a correction current to a plurality of connection paths 55a between the ramp wiring 55 and the plurality of voltage holding units 56. When supplying a ramp wave voltage to the ramp wiring 55, the plurality of correction current sources 58 supplies the same correction current to the plurality of connection paths 55a regardless of a luminance set in the plurality of pixel circuits 15.

The plurality of switches 61 is provided between the plurality of correction current sources 58 and the plurality of connection paths 55a. These switches 61 can be turned on or off individually.

In a case where the correction current is passed from the plurality of correction current sources 58 to the plurality of connection paths 55a and in a case where the correction current is not passed from the plurality of correction current sources 58 to the plurality of connection paths 55a, the current adjustment unit 60 adjusts the correction current on the basis of a voltage difference, on a predetermined connection path 55a of when a predetermined luminance is set to the pixel circuit 15 connected to the predetermined connection path 55a. The predetermined connection path 55a is, for example, a connection path 55a at a farthest end on the ramp wiring 55 from a position of the ramp buffer 51. The predetermined luminance is, for example, white luminance.

The current adjustment unit 60 may adjust the correction current a plurality of times, one time each in accordance with horizontal line scanning, within a blanking period between two consecutive frames.

The current adjustment unit 60 may have a first voltage detection unit 62, a second voltage detection unit 63, and the comparator 59.

The first voltage detection unit 62 detects the voltage of the connection path 55a at the farthest end from the ramp buffer 51 of when a first luminance is set in the plurality of pixel circuits 15, without passing the correction current from the plurality of correction current sources 58 to the plurality of connection paths 55a. The first luminance is, for example, white luminance.

The second voltage detection unit 63 passes a correction current from the plurality of correction current sources 58 to the connection paths 55a excluding the connection path 55a at the farthest end, sets the first luminance to the pixel circuit 15 connected to the connection path 55a at the farthest end, and detects the voltage of the connection path 55a at the farthest end when setting a second luminance to the other pixel circuits 15. The second luminance is, for example, black luminance.

The comparator 59 outputs a signal corresponding to a voltage difference between a voltage detected by the first voltage detection unit 62 and a voltage detected by the second voltage detection unit 63.

The display device 1 according to the present embodiment has technical features in the internal configuration and operation of the H-DRV unit 13. Hereinafter, the internal configuration and operation of the H-DRV unit 13 of the present embodiment will be described in detail. The display device 1 according to the present embodiment employs a system in which an offset voltage Vofs is supplied to the ramp wiring 55, threshold correction and mobility correction of the drive transistor 42 in the pixel circuit 15 are performed, and then a ramp wave voltage is supplied to generate a signal voltage.

The ramp buffer 51, which switches to the offset voltage or the ramp wave voltage and outputs the switched voltage, is connected to one end side of the ramp wiring 55. A plurality of signal lines is connected to the ramp wiring 55 via the plurality of voltage holding units 56, and wiring resistance on the ramp wiring 55 increases as a distance from the ramp buffer 51 increases. Therefore, for example, in a case where the ramp buffer 51 supplies a ramp wave voltage to the ramp wiring 55, a voltage of the connection paths 55a between the ramp wiring 55 and the plurality of voltage holding units 56 may fluctuate depending on a position of the connection path 55a.

Figure 5:
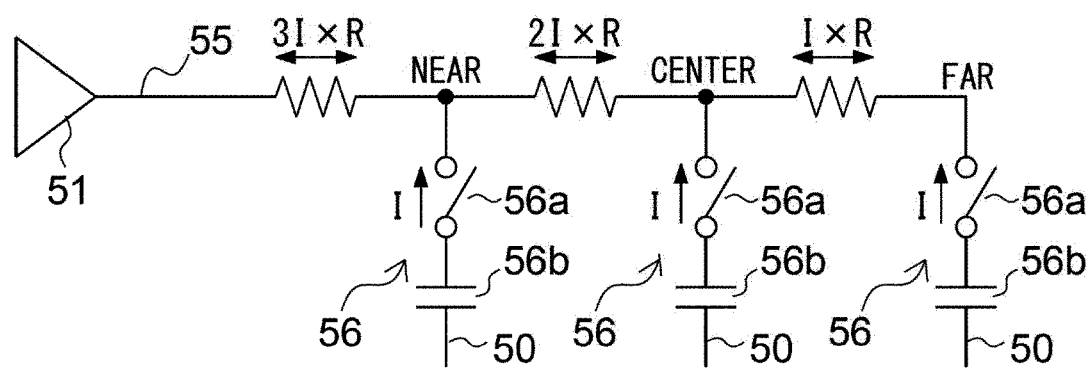
FIG. 5 is an equivalent circuit diagram in a case where three voltage holding units are connected to a ramp wiring.

FIG. 5 is an equivalent circuit diagram in a case where three voltage holding units 56 are connected to the ramp wiring 55. Although not illustrated in FIG. 5, the pixel circuit 15 is connected to each of the voltage holding units 56 via a corresponding signal line. Although a large number of voltage holding units 56 are connected to the ramp wiring 55 in practice, only three voltage holding units 56 are illustrated in a simplified manner in FIG. 5. Each of the voltage holding units 56 is equivalently represented by a switch 56a and a capacitor 56b. The capacitor 56b is a parasitic capacitance on the signal line 50.

In FIG. 5, it is assumed that wiring resistances R on the ramp wiring 55 are all equal on the connection path 55a between the ramp buffer 51 and the three voltage holding units 56. For example, in a case where white luminance is set for each of the pixel circuits 15, the switches 61 between the plurality of correction current sources 58 and the respective connection paths 55a are turned off so that the correction current from the correction current sources 58 does not flow through the connection paths 55a. Each of the voltage holding units 56 holds a voltage level when the ramp wave voltage is sufficiently small. At this time, current flows from each of the voltage holding units 56 to the ramp buffer 51 via the ramp wiring 55. In FIG. 5A, it is assumed that currents I that flow through the connection paths 55a between the respective voltage holding units 56 and the ramp wiring 55 are all equal. Because a current I flows between the connection path 55a at the farthest end and the connection path 55a second farthest from the ramp buffer 51, a voltage drop in this section is I×R. Because a current of 2I flows between the connection path 55a at a nearest end and the connection path 55a second farthest from the ramp buffer 51, a voltage drop in this section is 2I×R. Because a current of 3I flows between the connection path 55a at the nearest end from an output node of the ramp buffer 51, a voltage drop in this section is 3I×R.

Thus, because a voltage drop occurs between the connection paths 55a with the plurality of voltage holding units 56 in a case where white luminance is set for each pixel, voltages of the connection paths 55a differ from one another, and a voltage level is higher as the connection path 55a is farther from the ramp buffer 51. A variation in voltage of the connection paths 55a with the plurality of voltage holding units 56 on the ramp wiring 55 causes a variation in luminance of the display screen.

Figure 6:
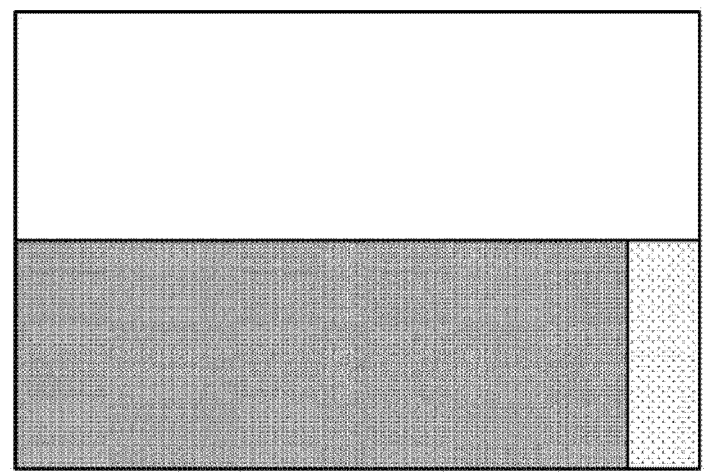
FIG. 6 is a diagram illustrating an example of horizontal crosstalk.

For example, FIG. 6 illustrates an example in which an image with white luminance is displayed in an upper half of the display screen, an image with white luminance is displayed in a region on one end side in a horizontal direction of a lower half of the display screen, and an image with black luminance is displayed in the remaining region of the lower half of the display screen. It is assumed that one end side in the horizontal direction is a position at the farthest end from the ramp buffer 51.

In the example in FIG. 6, there is a difference in brightness between the white luminance of the upper half of the display screen and the white luminance on the one end side in the horizontal direction of the lower half. In practice, an example is illustrated in which the white luminance of the one end side in the horizontal direction of the lower half is darker than the white luminance of the upper half. In some cases, there may be a case where the white luminance of the one end side in the horizontal direction of the lower half is brighter than the white luminance of the upper half.

Such a luminance difference is caused by a wiring resistance on the ramp wiring 55 and whether or not a correction current is supplied from the correction current sources 58 to the respective connection paths 55a. In the present specification, for convenience, such a luminance difference is referred to as horizontal crosstalk.

Note that FIG. 6 is a display example in a case where it is assumed that there is no shading phenomenon described in a second embodiment to be described later. In practice, shading in which luminance gradually changes in the horizontal direction may occur in a display region of the upper half of the screen, the display region being displayed in white.

In the present embodiment, a measure is taken to prevent horizontal crosstalk as illustrated in FIG. 6. In the present embodiment, horizontal crosstalk is reduced by supplying a correction current of an optimum amount of current from the plurality of correction current sources 58 to each of the connection paths 55a with the plurality of voltage holding units 56 on the ramp wiring 55.

Figure 7A:
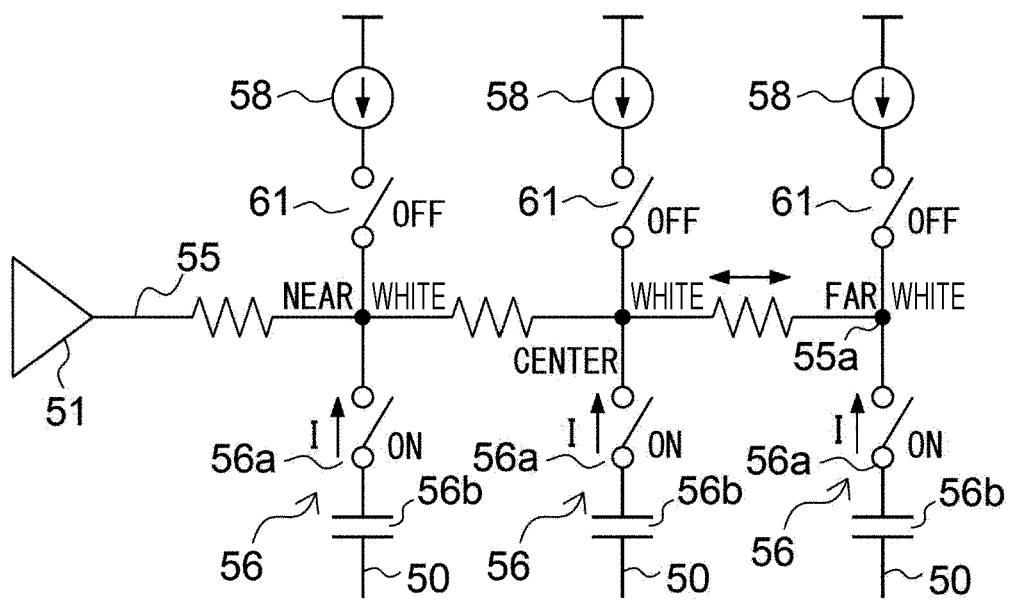
FIG. 7A is a diagram schematically illustrating operation by a current adjustment unit.
Figure 8:
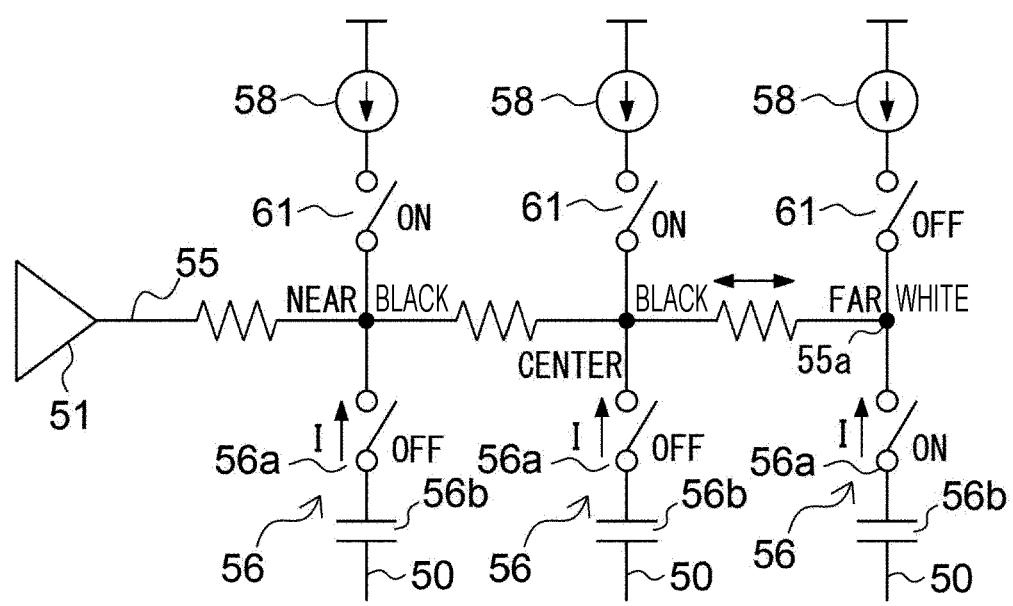
FIG. 8 is a diagram schematically illustrating operation by the current adjustment unit.

FIGS. 7A and 8 are diagrams schematically illustrating operation by the current adjustment unit 60. As illustrated in FIGS. 7A and 8, the plurality of correction current sources 58 is connected via the plurality of switches 61 on the connection paths 55a to which the plurality of voltage holding units 56 on the ramp wiring 55 is connected. For simplification, FIGS. 7A and 8 illustrate examples in which three correction current sources 58 are connected to three connection paths 55a via three switches 61. The correction current output from the plurality of correction current sources 58 is adjusted by the current adjustment unit 60. The plurality of correction current sources 58 outputs the same correction current. A switch 61 is provided between each of the correction current sources 58 and a corresponding connection path 55a, and each of the switches 61 can be individually turned on or off. Therefore, whether or not to pass the correction current through each of the connection paths 55a can be set for each connection path 55a.

Figure 7B:
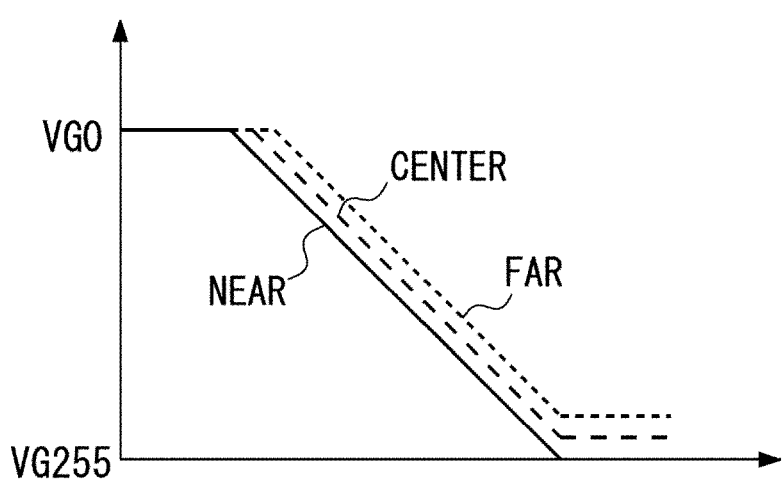
FIG. 7B is a diagram schematically illustrating voltage levels of connection paths with each of voltage holding units on the ramp wiring.

FIG. 7A illustrates an example in which white luminance is set in each of the pixel circuits 15. In this case, all the switches 61 of the correction current sources 58 are turned off, and the switches 56a of the three voltage holding units 56 are turned on. With this arrangement, similarly to FIG. 6, current flows from the voltage holding units 56 to the ramp buffer 51 via the connection paths 55a. Therefore, voltage of the connection path 55a at the farthest end from the ramp buffer 51 is highest. FIG. 7B is a diagram schematically illustrating voltage levels of the connection paths 55a with the respective voltage holding units 56 on the ramp wiring 55. In FIG. 7B, a horizontal axis represents time, and a vertical axis represents a voltage level. As illustrated, a connection path 55a farther from the ramp buffer 51 has a higher voltage level. Although FIG. 7B illustrates an example of ramp wave voltages of which voltage levels decrease from VG 0 to VG 255 with a constant gradient, ramp wave voltages of which the voltage levels increase from VG 0 to VG 255 with a constant gradient may be used. In that case also, a connection path 55a farther from the ramp buffer 51 has a higher voltage level of ramp wave voltage.

FIG. 8 illustrates an example in which white luminance is set for the pixel circuit 15 at the farthest end on the ramp wiring 55, and black luminance is set for the other pixel circuits 15. In this case, the switches 56a of the voltage holding units 56 connected to the pixel circuits 15 to which the black luminance is set are turned off, and the switches 61 of the correction current sources 58 are turned on. Therefore, a voltage drop on the ramp wiring 55 does not occur, and an increase in voltage of the connection path 55a at the farthest end from the ramp buffer 51 is reduced.

The current adjustment unit 60 according to the present embodiment adjusts correction currents output from the correction current sources 58 so that the voltage of the connection path 55a at the farthest end in the case of FIG. 8 matches the voltage of the connection path 55a at the farthest end in the case of FIG. 7A. That is, when black luminance is set (at a time of a black raster), the voltage of the connection path 55a at the farthest end is intentionally raised. With this arrangement, as illustrated in FIG. 6, in a case where the upper half has white luminance, the one end side in the horizontal direction of the lower half has white luminance, and the remaining region has black luminance, there is no difference in brightness between the white luminance of the upper half and the white luminance of the one end side in the horizontal direction of the lower half.

Figure 9:
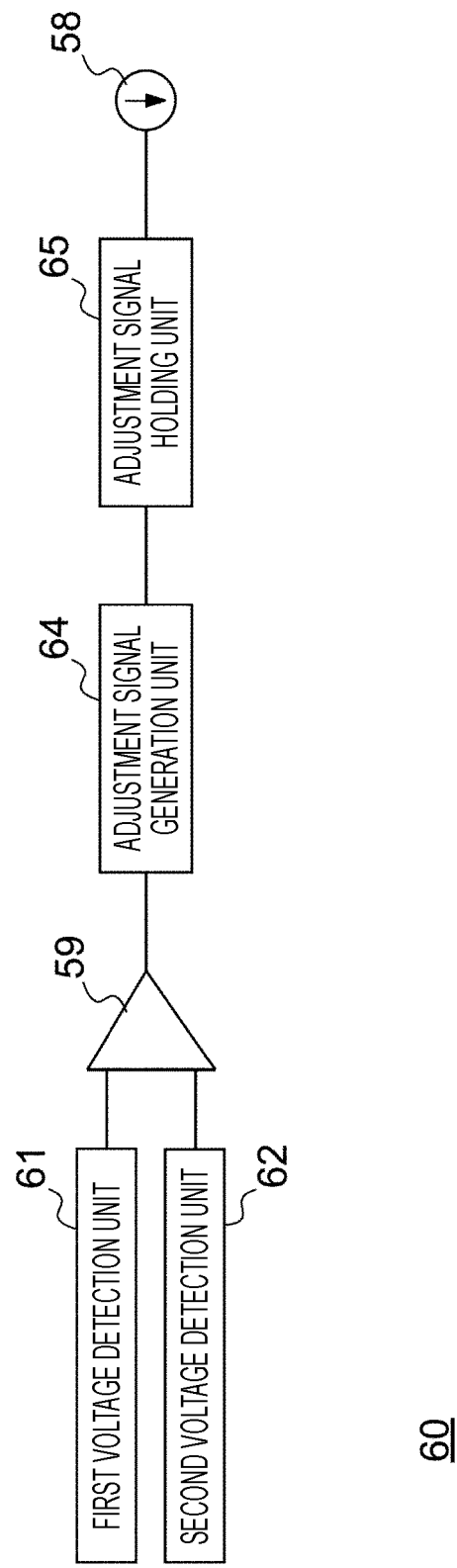
FIG. 9 is a block diagram illustrating a schematic configuration of the current adjustment unit according to the present embodiment.

FIG. 9 is a block diagram illustrating a schematic configuration of the current adjustment unit 60 according to the present embodiment. The current adjustment unit 60 has the first voltage detection unit 62, the second voltage detection unit 63, the comparator 59, an adjustment signal generation unit 64, and an adjustment signal holding unit 65.

As described above, the comparator 59 outputs a signal corresponding to a voltage difference between a voltage detected by the first voltage detection unit 62 and a voltage detected by the second voltage detection unit 63. On the basis of the signal output from the comparator 59, the adjustment signal generation unit 64 generates an adjustment signal including a plurality of bits, the adjustment signal being for the current adjustment unit 60 to adjust the correction current. The adjustment signal holding unit 65 holds the adjustment signal generated by the adjustment signal generation unit 64. The correction current source 58 outputs a correction current corresponding to the adjustment signal.

As a specific method of operation by the current adjustment unit 60, a successive-approximation method and a charge-pump control method may be considered. Hereinafter, description will be given in order.

Figure 10:
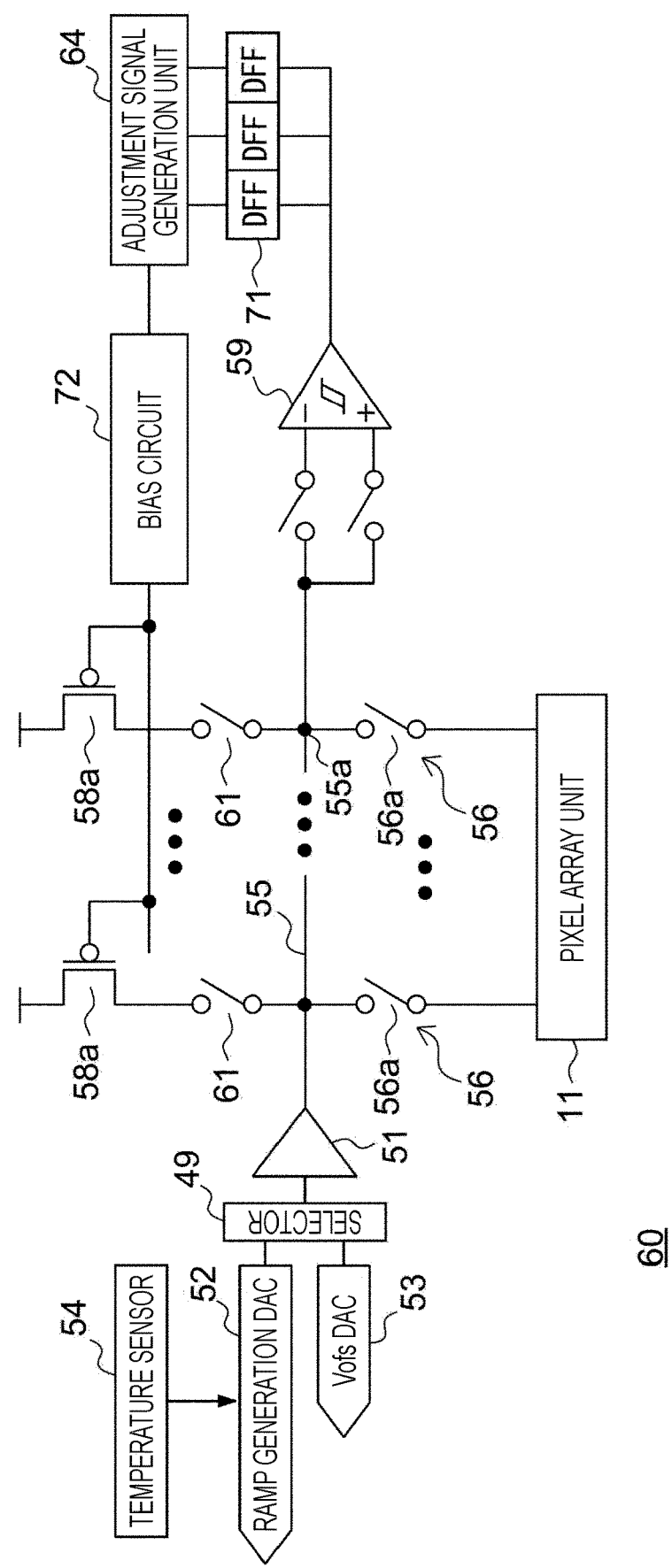
FIG. 10 is a block diagram illustrating an internal configuration of a current adjustment unit using a successive-approximation method.

FIG. 10 is a block diagram illustrating an internal configuration of the current adjustment unit 60 using the successive-approximation method. The current adjustment unit 60 in FIG. 10 has a plurality of DFFs (D-type flip-flops) 71 connected to an output path of the comparator 59, the adjustment signal generation unit 64 that generates an adjustment signal of a plurality of bits on the basis of outputs of the plurality of DFFs 71, and a bias circuit 72 that generates a bias voltage on the basis of the adjustment signal.

The plurality of correction current sources 58 has a plurality of NMOS transistors 58a that controls a correction current according to the bias voltage output from the bias circuit 72. The bias voltage is supplied to gates of these NMOS transistors 58a, and each of the NMOS transistors 58a supplies the same correction current to each of the connection paths 55a via the switches 61.

The current adjustment unit 60 in FIG. 10 latches output signals from the comparator 59 in any one of the plurality of DFFs 71 in rotation. Because the comparator 59 performs comparison operation once for each horizontal line, comparison results in the comparator 59 are latched in separate DFFs 71 for the number of horizontal lines corresponding to the number of the plurality of DFFs 71. The adjustment signal generation unit 64 generates an adjustment signal including a plurality of bits on the basis of the latch results of the plurality of DFFs 71.

Figure 11:
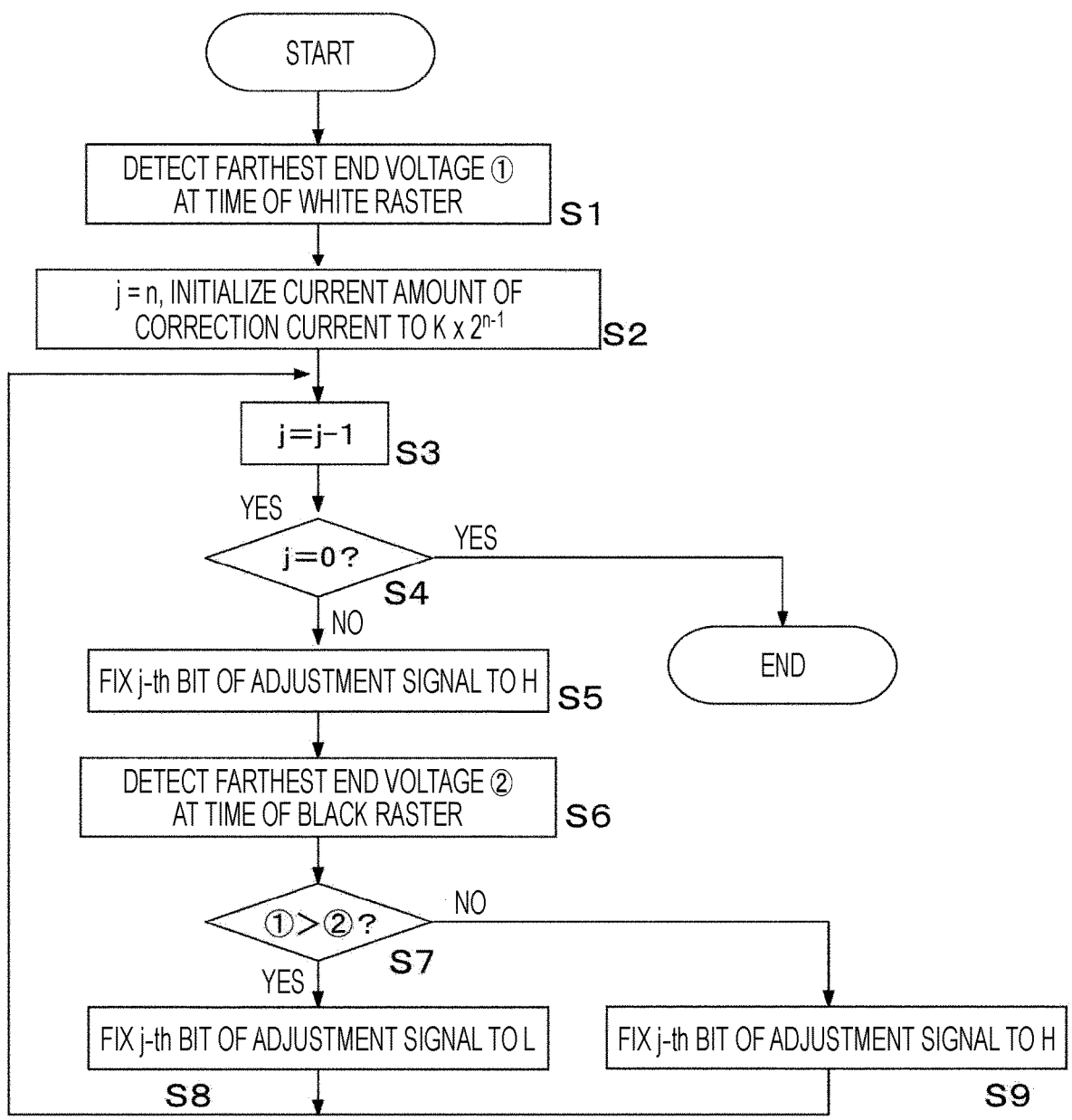
FIG. 11 is a flowchart illustrating processing operation by the current adjustment unit in FIG. 10.

FIG. 11 is a flowchart illustrating processing operation by the current adjustment unit 60 in FIG. 10. First, in a state where white luminance is set to all the pixel circuits 15 connected to a certain horizontal line (at a time of a white raster), a voltage of the connection path 55a between the voltage holding unit 56 at the farthest end from the ramp buffer 51 and the ramp wiring 55 is detected (Step S1). The processing in Step S1 is performed by the first voltage detection unit 62.

Next, current amounts of the plurality of correction current sources 58 are initialized to $K \times 2^{n-1}$, and a variable j indicating the number of adjustment times is initialized to n (Step S2). Next, j is decremented by 1 (Step S3).

Next, it is determined whether or not j=0 (Step S4). If j=0, the processing ends. If j=0 is not satisfied, a j-th bit of the adjustment signal is fixed to H (Step S5). Next, at a time of driving all current sources when all the correction current sources 58 other than the correction current source 58 at the farthest end from the ramp buffer 51 (at a time of a black raster), a voltage of the connection path 55a between the voltage holding unit 56 at the farthest end from the ramp buffer 51 and the ramp wiring 55 is detected (Step S6). The processing in Step S6 is performed by the second voltage detection unit 63.

Next, it is determined whether or not the voltage detected in Step S1 is higher than the voltage detected in Step S6 (Step S7). The determination processing in Step S7 is performed by the comparator 59, and the output of the comparator 59 indicates a result of the determination in Step S7.

In a case where Step S7 is YES, the j-th bit of the adjustment signal is changed to L (Step S8). With this arrangement, the correction current output from the correction current source 58 is adjusted. Thereafter, the processing in and after Step S3 is repeated.

Meanwhile, in a case where Step S7 is NO, the j-th bit of the adjustment signal is fixed to H (Step S9), and the processing in and after Step S3 is repeated.

Thus, in the successive-approximation method, a plurality of bits of an adjustment signal is confirmed bit by bit each time of adjustment.

Figure 12:
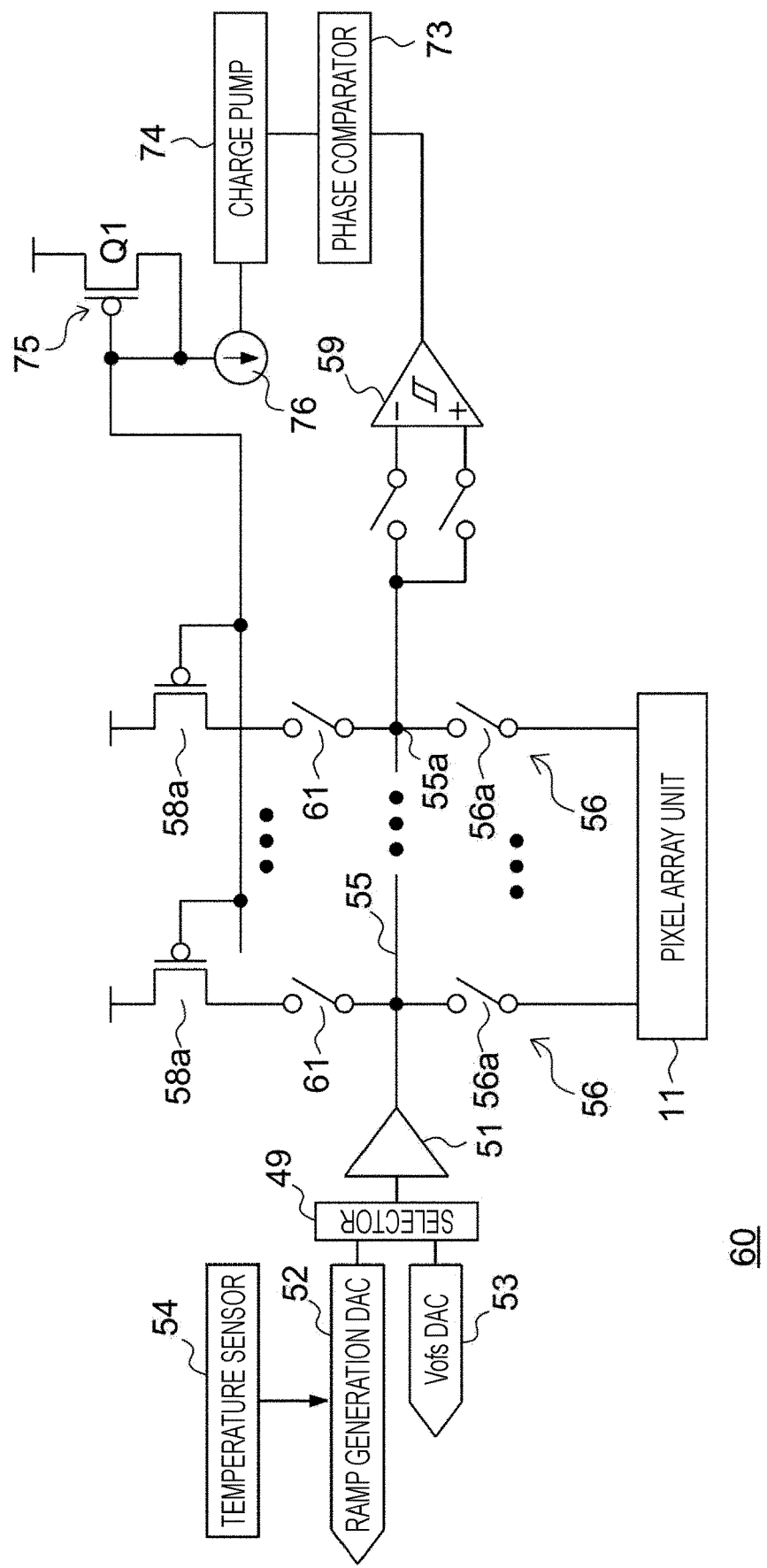
FIG. 12 is a block diagram illustrating an internal configuration of a current adjustment unit using a charge-pump control method.

FIG. 12 is a block diagram illustrating an internal configuration of the current adjustment unit 60 using a charge-pump control method. The current adjustment unit 60 in FIG. 12 has a phase comparator 73 connected to an output path of the comparator 59, a charge pump 74, and cascode current mirror circuit 75.

Similarly to FIG. 10, the plurality of correction current sources 58 in FIG. 12 has a plurality of NMOS transistors that operate at the same gate voltage.

The phase comparator 73 outputs a phase difference pulse between the output signal from the comparator 59 and a reference pulse signal that outputs a pulse at a timing determined for each horizontal line. The charge pump 74 controls the current source 76 such that a current source 76 in a bias voltage source 75 passes a constant current during a period of the phase difference pulse output from the phase comparator 73. The bias voltage source 75 has a PMOS transistor Q1 having a gate and drain connected to the current source 76. A bias voltage is output from a gate of the PMOS transistor Q1, and the bias voltage is input to a gate of each of PMOS transistors 58a of the correction current sources 58.

Figure 13:
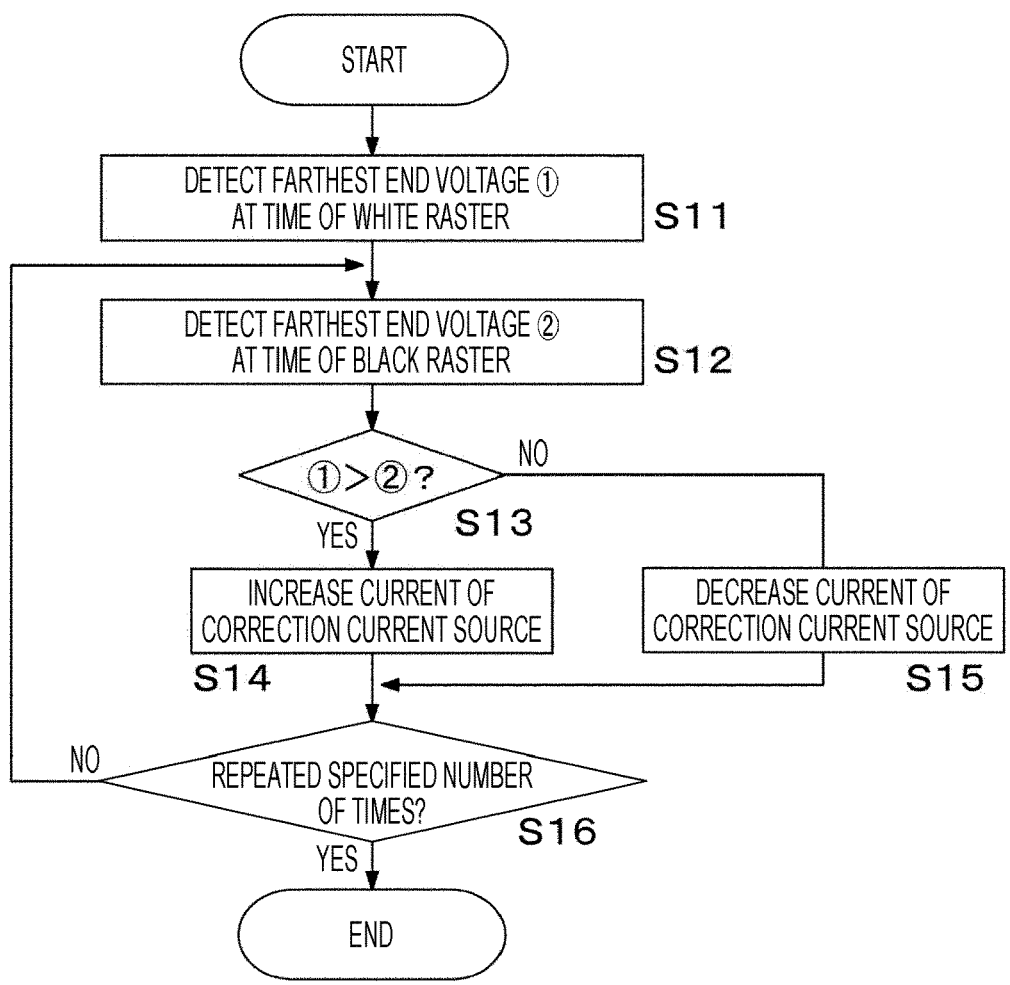
FIG. 13 is a flowchart illustrating processing operation by the current adjustment unit in FIG. 12.

FIG. 13 is a flowchart illustrating processing operation by the current adjustment unit 60 in FIG. 12. First, in a state where white luminance is set to all the pixel circuits 15 connected to a certain horizontal line (at a time of a white raster), a voltage of the connection path 55a between the voltage holding unit 56 at the farthest end from the ramp buffer 51 and the ramp wiring 55 is detected (Step S11). The processing in Step S11 is performed by the first voltage detection unit 62.

Next, at a time of driving all the current sources 76 when all the correction current sources 58 other than the correction current source 58 at the farthest end from the ramp buffer 51 (at a time of a black raster), a voltage of the connection path 55a between the voltage holding unit 56 at the farthest end from the ramp buffer 51 and the ramp wiring 55 is detected (Step S12). The processing in Step S12 is performed by the second voltage detection unit 63.

Next, it is determined whether or not the voltage detected in Step S11 is higher than the voltage detected in Step S12 (Step S13). The determination processing in Step S13 is performed by the comparator 59, and the output of the comparator 59 indicates a result of the determination in Step S13.

In a case where Step S13 is YES, control to increase the correction current is performed (Step S14), and the processing in and after Step S12 is repeated. Meanwhile, in a case where Step S13 is NO, control to reduce the correction current is performed (Step S15).

Next, it is determined whether or not the correction current has been adjusted a specified number of times (Step S16). If the specified number of times has not been reached, the processing in and after Step S12 is repeated. If the specified number of times has been reached, the processing ends.

Thus, in the first embodiment, because the correction current that flows from the plurality of correction current sources 58 to the respective connection paths 55a is adjusted on the basis of the voltage difference, which is generated by wiring resistance of the ramp wiring 55, of the connection path 55a and the respective voltage holding units 56 on the ramp wiring 55, a luminance difference between pixels can be made inconspicuous in a case where arbitrary luminance is set for the plurality of pixel circuits 15. More specifically, in a case where a region on an upper half of the display screen is set to white luminance, a region on the one end side in the horizontal direction of a lower half of the display screen is set to white luminance, and the remaining lower half region of the display screen is set to black luminance, a luminance difference between the white luminance of the region on the upper half and the white luminance of the region on the one end side in the horizontal direction of the lower half can be made inconspicuous.

Second Embodiment

As described above, the voltage of the connection paths 55a with the voltage holding units 56 connected to the ramp wiring 55 may be different between a side close to the ramp buffer 51 on the ramp wiring 55 and a side far from the ramp buffer 51 on the ramp wiring 55, and this may cause shading in which luminance in the display screen changes in the horizontal direction.

Figure 14:
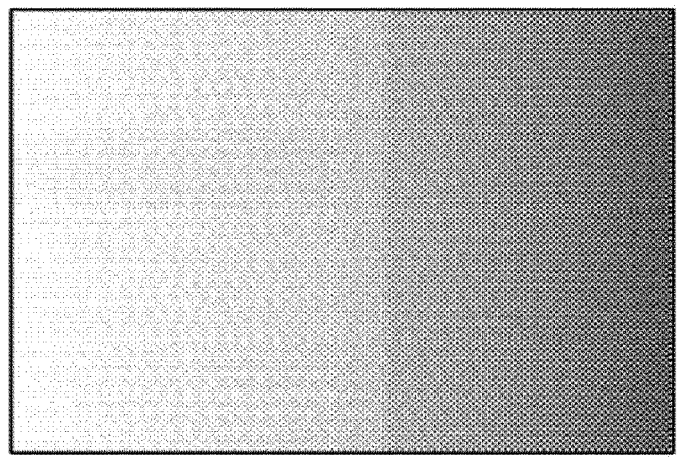
FIG. 14 is a diagram illustrating an example of horizontal shading.

FIG. 14 illustrates an example in which shading occurs in a case where an entire display screen is displayed with white luminance. The second embodiment reduces such shading.

In the first embodiment, when a ramp wave voltage is supplied to the ramp wiring 55 and a signal voltage corresponding to gradation is held in each of the voltage holding units 56 connected to the ramp wiring 55, a correction current supplied from each of the correction current sources 58 to each of the connection paths 55a is adjusted in order to reduce horizontal crosstalk caused on the display screen by a voltage difference on a connection path 55a of each of the voltage holding units 56 and the ramp wiring 55. The adjustment of the correction current in the first embodiment is performed within a period in which the ramp wave voltage is supplied to the ramp wiring 55.

Each of the pixel circuits 15 causes a light emission part 41 to emit light with luminance corresponding to a voltage difference between an offset voltage and a signal voltage. In a case of the first embodiment, the signal voltage is corrected as a result by the correction current from the correction current sources 58, and if the offset voltage is not corrected accordingly, a variation in luminance of the light emission parts 41 may occur.

Therefore, in the second embodiment, a correction current supplied from a plurality of correction current sources 58 to connection paths 55a with respective voltage holding units 56 on the ramp wiring 55 is adjusted within a period in which an offset voltage is supplied to a ramp wiring 55, similarly to the first embodiment. The current amount of the correction current that is passed from each of the connection paths 55a to each of the correction current sources 58 may be the same as that in the first embodiment. Therefore, the correction current decided by a method described in the first embodiment is supplied from all the correction current sources 58 to the connection paths 55a with the respective voltage holding units 56 on the ramp wiring 55 during the supply period of the offset voltage.

Thus, in the second embodiment, the current adjustment unit 60 described in the first embodiment can be applied as is, and a horizontal shading measure according to the second embodiment can be performed by utilizing the current adjustment unit 60 described in the first embodiment.

With this arrangement, a voltage of a connection path 55a with each of the respective voltage holding units 56 on the ramp wiring 55 is corrected in the same manner between an offset voltage supply period and a ramp wave voltage supply period, and a variation in luminance of a light emission part 41 in each of the pixel circuits 15 can be reduced. Therefore, shading in a horizontal direction as illustrated in FIG. 14 is made inconspicuous.

Furthermore, the offset voltage is a pulse voltage having a constant voltage level, and can be supplied to each of the pixel circuits 15 in a period shorter than a period during which a ramp wave voltage is supplied, achieving quick threshold correction and mobility correction of a drive transistor 42 in each of the pixel circuits 15.

Third Embodiment

Unlike the first and second embodiments, a third embodiment does not include correction current sources 58 and current adjustment units 60. The offset voltage in the first and second embodiments is a pulse voltage having a constant voltage level, while an offset voltage in the third embodiment is a voltage having a voltage level continuously changes. That is, in the third embodiment, the offset voltage for performing threshold correction and mobility correction of a drive transistor 42 in a pixel circuit 15 is a ramp wave.

Figure 15:
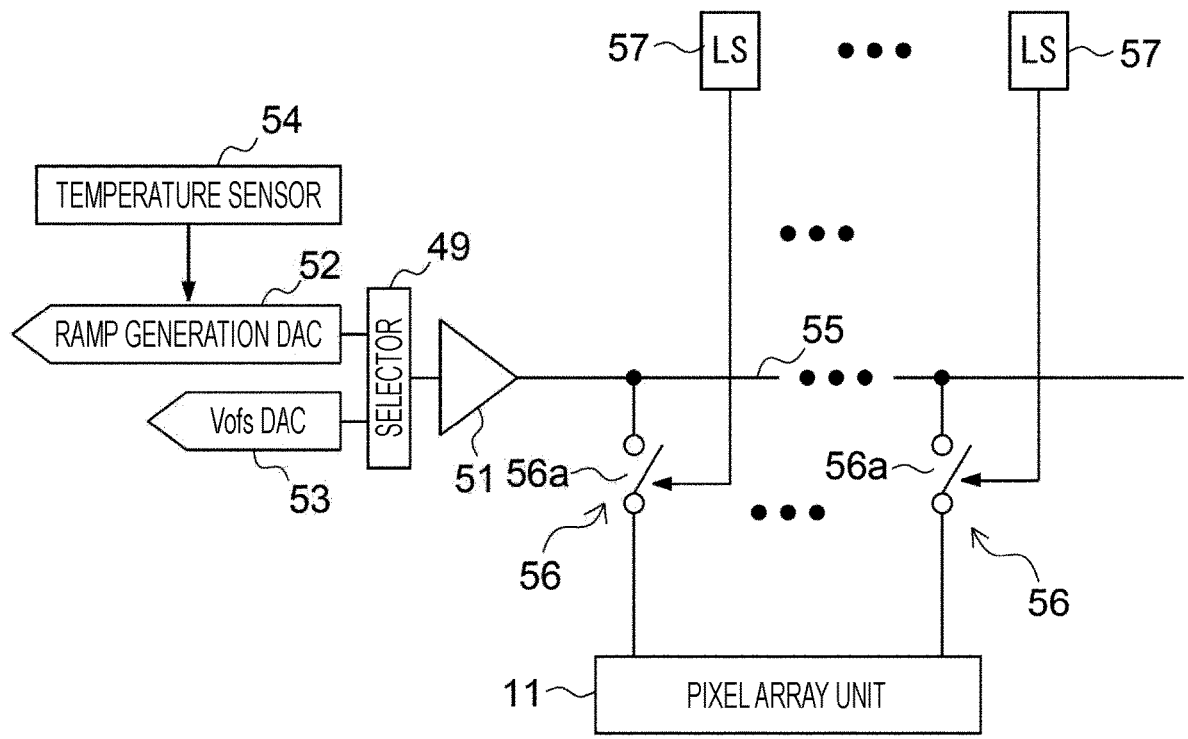
FIG. 15 is a block diagram illustrating an internal configuration of the H-DRV unit according to a third embodiment.

A display device 1 according to the third embodiment is different from the first and second embodiments in an internal configuration of an H-DRV unit 13. FIG. 15 is a block diagram illustrating an internal configuration of the H-DRV unit 13 according to a third embodiment. As compared with FIG. 4, the H-DRV unit 13 in FIG. 15 does not include correction current sources 58, switches 61, and a current adjustment unit 60.

A Vofs DAC 53 connected to an input terminal of a ramp buffer 51 generates an offset voltage including the ramp wave. Therefore, the offset voltage supplied from the ramp buffer 51 to a ramp wiring 55 becomes a ramp wave of which voltage level continuously changes.

Figure 16:
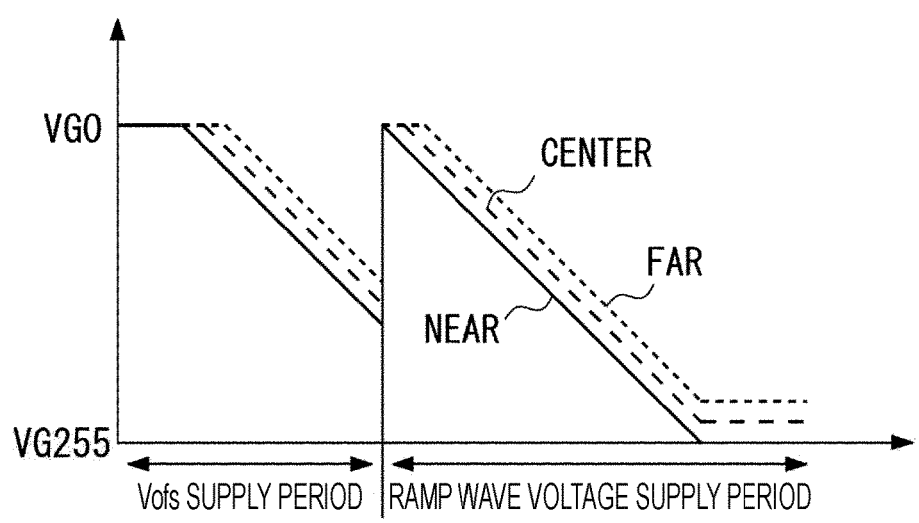
FIG. 16 is a voltage waveform diagram on the ramp wiring.

FIG. 16 is a voltage waveform diagram on the ramp wiring 55. Time from time t1 to time t2 is an offset voltage supply period, and time from the time t2 to time t3 is a ramp wave voltage supply period for generating a signal voltage.

The pixel circuit 15 holds an offset voltage on the ramp wiring 55, and, by holding a voltage before a voltage level of the offset voltage starts to decrease, can perform threshold correction and mobility correction of a drive transistor 42 by using an offset voltage having a voltage level same as the voltage level of the offset voltage used in the first and second embodiments.

As illustrated in FIG. 16, because the ramp wiring 55 has a wiring resistance, voltage levels of connection paths 55*a* with a respective plurality of voltage holding units 56 on the ramp wiring 55 vary depending on a distance from the ramp buffer 51. However, a voltage difference of each of the connection paths 55*a* in a period during which the offset voltage is supplied is the same as a voltage difference of each of the connection paths 55*a* in a period during which the ramp wave voltage is supplied. Because each of the pixel circuits 15 emits light with luminance corresponding to a voltage difference between the signal voltage and the offset voltage, the voltage difference due to the wiring resistance on the ramp wiring 55 can be canceled at a stage of detecting the voltage difference between the signal voltage and the offset voltage, and therefore, horizontal shading becomes inconspicuous.

Thus, in the third embodiment, by adopting a simple configuration in which the correction current sources 58, the switches 61, and the current adjustment unit 60 are omitted from the H-DRV unit 13 in FIG. 4, and by setting the offset voltage to a ramp waveform, it is possible to cause a light emission part 41 to emit light after canceling the voltage difference due to the wiring resistance on the ramp wiring 55, and to reduce horizontal shading with a simpler configuration than the second embodiment.

Note that the present technology can have the following configurations.

(1) A display device including
a plurality of pixel circuits arranged in at least one direction,
a plurality of signal lines that supplies the plurality of pixel circuits with signal voltage corresponding to gradation,
a voltage output unit that generates ramp wave voltage having a voltage level that changes with time,
a ramp wiring that supplies the ramp wave voltage generated in the voltage output unit,
a plurality of voltage holding units that is connected between the ramp wiring and the plurality of signal lines, and holds the ramp wave voltage at a timing corresponding to luminance of the plurality of pixel circuits to generate the signal voltage,
a plurality of correction current sources that supplies correction current to a plurality of connection paths of the ramp wiring and the plurality of voltage holding units, and
a current adjustment unit that adjusts the correction current on the basis of a voltage difference, on a predetermined connection path, of when setting a predetermined luminance to a pixel circuit connected to the predetermined connection path, in a case where the correction current is passed from the plurality of correction current sources to the plurality of connection paths, and in a case where the correction current is not passed from the plurality of correction current sources to the plurality of connection paths.

(2) The display device according to (1), in which, when the ramp wave voltage is supplied to the ramp wiring, the plurality of correction current sources supplies the same correction current to the plurality of connection paths regardless of luminance set to the plurality of pixel circuits.

(3) The display device according to (1) or (2), in which the predetermined connection path includes a connection path at a farthest end on the ramp wiring from a position of the voltage output unit, and the predetermined luminance includes white luminance.

(4) The display device according to any one of (1) to (3), in which the current adjustment unit has
a first voltage detection unit that detects voltage, on the connection path at the farthest end from the voltage output unit, of when a first luminance is set to the plurality of pixel circuits without passing the correction current from the plurality of correction current sources to the plurality of connection paths, and
a second voltage detection unit that detects voltage on the connection path at the farthest end for when passing the correction current from the plurality of correction current sources to connection paths excluding the connection path at the farthest end to set the first luminance to a pixel circuit connected to the connection path at the farthest end and to set a second luminance to pixel circuits other than the pixel circuit connected to the connection path at the farthest end, and
the current adjustment unit adjusts the correction current on the basis of the voltage difference between the voltage detected by the first voltage detection unit and the voltage detected by the second voltage detection unit.

(5) The display device according to (4), in which the current adjustment unit adjusts the correction current so that the voltage detected by the second voltage detection unit matches the voltage detected by the first voltage detection unit.

(6) The display device according to (4) or (5), in which the current adjustment unit performs a plurality of times, once for each horizontal line scanning timing, processing of increasing the correction current in a case where the voltage detected by the second voltage detection unit is lower than the voltage detected by the first voltage detection unit, and of decreasing the correction current in a case where the voltage detected by the second voltage detection unit is higher than the voltage detected by the first voltage detection unit.

(7) The display device according to any one of (4) to (6), in which the current adjustment unit has
a voltage comparator that outputs a signal corresponding to a voltage difference between the voltage detected by the first voltage detection unit and the voltage detected by the second voltage detection unit, and
an adjustment signal generation unit that generates, on the basis of the signal output from the voltage comparator, an adjustment signal including a plurality of bits, the adjustment signal being for the current adjustment unit to adjust the correction current, and
the current adjustment unit adjusts the correction current on the basis of the adjustment signal.

(8) The display device according to (7), in which the adjustment signal generation unit adjusts the adjustment signal by one bit each time the correction current is adjusted.

(9) The display device according to any one of (4) to (6), in which the current adjustment unit has
a voltage comparator that outputs a signal corresponding to a voltage difference between the voltage detected by the first voltage detection unit and the voltage detected by the second voltage detection unit,
a phase comparator that outputs a signal corresponding to a phase difference between the signal output from the voltage comparator and a predetermined reference signal, and
a charge pump that outputs voltage corresponding to the signal output from the phase comparator, and
the current adjustment unit adjusts the correction current on the basis of the voltage output from the charge pump.

(10) The display device according to (9),
in which the predetermined reference signal has frequency corresponding to a horizontal line scanning period, and
the voltage comparator outputs a signal corresponding to the voltage difference once for each horizontal line.

(11) The display device according to (9) or (10),
in which the correction current source has a transistor that changes the correction current according to gate voltage, and
further includes a bias circuit that controls the gate voltage with the voltage output from the charge pump.

(12) The display device according to any one of (4) to
in which the first luminance includes white luminance, and
the second luminance includes black luminance.

(13) The display device according to any one of (1) to (12),
in which the voltage output unit outputs offset voltage for correcting a variation in characteristic of the plurality of pixel circuits to the ramp wiring before outputting the ramp wave voltage to the ramp wiring, and
when the voltage output unit supplies the offset voltage to the ramp wiring, the current adjustment unit adjusts, on the basis of the voltage difference, the correction current supplied to the plurality of connection paths by the plurality of correction current sources.

(14) The display device according to (13), in which the current adjustment unit supplies the same correction current from the plurality of correction current sources to the plurality of connection paths in a case where the voltage output unit supplies the offset voltage to the ramp wiring and in a case where the voltage output unit supplies the ramp voltage to the ramp wiring.

(15) The display device according to any one of (1) to (14), in which the current adjustment unit adjusts the correction current a plurality of times, one time each in accordance with horizontal line scanning, within a blanking period between two consecutive frames.

(16) A display device including
a plurality of pixel circuits arranged in at least one direction,
a plurality of signal lines that supplies the plurality of pixel circuits with signal voltage corresponding to gradation,
a voltage output unit that generates offset voltage for correcting a variation in characteristic of the plurality of pixel circuits and ramp wave voltage having a voltage level that changes with time,
a ramp wiring that switches to the offset voltage or the ramp wave voltage and supplies the switched voltage,
a plurality of voltage holding units that is connected between the ramp wiring and the plurality of signal lines, and holds the ramp wave voltage at a timing corresponding to luminance of the plurality of pixel circuits to generate the signal voltage,
a plurality of correction current sources that supplies correction current to a plurality of connection paths of the ramp wiring and the plurality of voltage holding units, and
a current adjustment unit that adjusts, on the basis of a voltage difference of the plurality of connection paths, the voltage difference being generated due to current that flows from the plurality of voltage holding units to the voltage output unit when a predetermined luminance is set to the plurality of pixel circuits, the correction current supplied to the plurality of connection paths by the plurality of correction current sources when the offset voltage and the ramp wave voltage are supplied to the ramp wiring.

Aspects of the present disclosure are not limited to the above-described individual embodiments, and include various modifications that may be conceived by those skilled in the art, and the effects of the present disclosure are not limited to the above-described content. That is, various additions, modifications, and partial deletions can be made without departing from the conceptual ideas and spirit of the present disclosure derived from the content defined in the claims and equivalents thereof.

REFERENCE SIGNS LIST

1 Display device
2 Display system
3 Display controller
4 Timing controller
5 Data input/output I/F unit
11 Pixel array unit
12 V-DRV unit
13 H-DRV unit
14 Signal processing unit
15 Pixel circuit 16 Write scanning unit
17 Drive scanning unit
21 HLOGIC unit
22 VLOGIC unit
23 Clock generator
24 Timing generator
25 Image processing unit
31 Image I/F unit
32 Data S/P unit
33 Clock control unit
34 H/V synchronization unit
41 Light emission part
42 Drive transistor
43 Sampling transistor
44 Light emission control transistor
45 Holding capacitor
46 Auxiliary capacitor
51 Ramp buffer
52 Ramp generation DAC
53 Vofs DAC
54 Temperature sensor
55 Ramp wiring
56 Voltage holding unit
56a Switch
57 Level shifter
58 Correction current source
59 Comparator
60 Current adjustment unit
61 Switch
62 First voltage detection unit
63 Second voltage detection unit

The invention claimed is:

1. A display device, comprising:
a plurality of pixel circuits in at least one direction;
a plurality of signal lines that supplies the plurality of pixel circuits with signal voltage corresponding to gradation;
a voltage output unit that generates ramp wave voltage having a voltage level that changes with time;
a ramp wiring that supplies the generated ramp wave voltage;
a plurality of voltage holding units that is connected between the ramp wiring and the plurality of signal lines, and holds the generated ramp wave voltage at a timing corresponding to luminance of the plurality of pixel circuits to generate the signal voltage;
a plurality of correction current sources that supplies correction current to a plurality of connection paths of the ramp wiring and the plurality of voltage holding units; and
a current adjustment unit that adjusts the correction current based on a voltage difference, on a specific connection path, when setting a specific luminance to a pixel circuit connected to the specific connection path, in a case where the correction current is passed from the plurality of correction current sources to the plurality of connection paths, and in a case where the correction current is not passed from the plurality of correction current sources to the plurality of connection paths.

2. The display device according to claim 1, wherein, when the generated ramp wave voltage is supplied to the ramp wiring, the plurality of correction current sources supplies the correction current to the plurality of connection paths regardless of luminance set to the plurality of pixel circuits.

3. The display device according to claim 1,
wherein the specific connection path includes a connection path at a farthest end on the ramp wiring from a position of the voltage output unit, and
the specific luminance includes white luminance.

4. The display device according to claim 1,
wherein the current adjustment unit includes:
a first voltage detection unit that detects voltage, on a connection path at a farthest end from the voltage output unit, when a first luminance is set to the plurality of pixel circuits without passing the correction current from the plurality of correction current sources to the plurality of connection paths, and
a second voltage detection unit that detects voltage on the connection path at the farthest end when passing the correction current from the plurality of correction current sources to connection paths excluding the connection path at the farthest end to set the first luminance to a pixel circuit connected to the connection path at the farthest end and to set a second luminance to pixel circuits other than the pixel circuit connected to the connection path at the farthest end, and
the current adjustment unit adjusts the correction current based on the voltage difference between the detected voltage of the first voltage detection unit and the detected voltage of the second voltage detection unit.

5. The display device according to claim 4, wherein the current adjustment unit adjusts the correction current so that the detected voltage of the second voltage detection unit matches the detected voltage of the first voltage detection unit.

6. The display device according to claim 4, wherein the current adjustment unit performs a plurality of times, once for each horizontal line scanning timing, processing of increasing the correction current in a case where the detected voltage of the second voltage detection unit is lower than the detected voltage of the first voltage detection unit, and of decreasing the correction current in a case where the detected voltage of the second voltage detection unit is higher than the detected voltage of the first voltage detection unit.

7. The display device according to claim 4,
wherein the current adjustment unit includes:
a voltage comparator that outputs a signal corresponding to a voltage difference between the detected voltage of the first voltage detection unit and the detected voltage of the second voltage detection unit, and
an adjustment signal generation unit that generates, based on the outputted signal from the voltage comparator, an adjustment signal including a plurality of bits, the adjustment signal being for the current adjustment unit to adjust the correction current, and
the current adjustment unit adjusts the correction current based on the adjustment signal.

8. The display device according to claim 7, wherein the adjustment signal generation unit adjusts the adjustment signal by one bit each time the correction current is adjusted.

9. The display device according to claim 4,
wherein the current adjustment unit includes:
a voltage comparator that outputs a signal corresponding to a voltage difference between the detected voltage of the first voltage detection unit and the detected voltage of the second voltage detection unit,
a phase comparator that outputs a signal corresponding to a phase difference between the signal output from the voltage comparator and a specific reference signal, and a charge pump that outputs voltage corresponding to the signal output from the phase comparator, and the current adjustment unit adjusts the correction current based on the outputted voltage from the charge pump.

10. The display device according to claim 9, wherein the specific reference signal has frequency corresponding to a horizontal line scanning period, and the voltage comparator outputs a signal corresponding to the voltage difference once for each horizontal line.

11. The display device according to claim 9, wherein the plurality of correction current sources includes: a transistor that changes the correction current based on gate voltage, and a bias circuit that controls the gate voltage with the outputted voltage from the charge pump.

12. The display device according to claim 4, wherein the first luminance includes white luminance, and the second luminance includes black luminance.

13. The display device according to claim 1, wherein the voltage output unit outputs offset voltage to correct a variation in characteristic of the plurality of pixel circuits to the ramp wiring before outputting the ramp wave voltage to the ramp wiring, and when the voltage output unit supplies the offset voltage to the ramp wiring, the current adjustment unit adjusts, based on the voltage difference, the correction current supplied to the plurality of connection paths by the plurality of correction current sources.

14. The display device according to claim 13, wherein the current adjustment unit supplies the correction current from the plurality of correction current sources to the plurality of connection paths in a case where the voltage output unit supplies the offset voltage to the ramp wiring and in a case where the voltage output unit supplies the generated ramp wave voltage to the ramp wiring.

15. The display device according to claim 1, wherein the current adjustment unit adjusts the correction current a plurality of times, one time each in accordance with horizontal line scanning, within a blanking period between two consecutive frames.

16. A display device comprising:

a plurality of pixel circuits in at least one direction;

a plurality of signal lines that supplies the plurality of pixel circuits with signal voltage corresponding to gradation;

a voltage output unit that generates offset voltage for correcting a variation in characteristic of the plurality of pixel circuits and ramp wave voltage having a voltage level that changes with time;

a ramp wiring that switches to the generated offset voltage or the generated ramp wave voltage and supplies the switched voltage;

a plurality of voltage holding units that is connected between the ramp wiring and the plurality of signal lines, and holds the generated ramp wave voltage at a timing corresponding to luminance of the plurality of pixel circuits to generate the signal voltage;

a plurality of correction current sources that supplies correction current to a plurality of connection paths of the ramp wiring and the plurality of voltage holding units; and a current adjustment unit that adjusts, based on a voltage difference of the plurality of connection paths, the voltage difference being generated due to current that flows from the plurality of voltage holding units to the voltage output unit when a specific luminance is set to the plurality of pixel circuits, the correction current supplied to the plurality of connection paths by the plurality of correction current sources when the generated offset voltage and the generated ramp wave voltage are supplied to the ramp wiring.

\* \* \* \* \*